United States Patent [19]

Stewart

[11] 4,003,007

[45] Jan. 11, 1977

[54] HIGH POWER PULSE COMPRESSION TECHNIQUES

[75] Inventor: Alexander G. Stewart, Columbia, Md.

[73] Assignee: The United States of America as represented by the Secretary of the Army, Washington, D.C.

[22] Filed: Nov. 13, 1975

[21] Appl. No.: 631,793

[52] U.S. Cl. .................................. 333/20; 307/106; 328/53; 328/65

[51] Int. Cl.[2] ........................ H01P 1/00; H03K 5/04

[58] Field of Search ............. 333/20; 307/264, 106; 328/53, 61, 63, 65, 168

[56] References Cited

UNITED STATES PATENTS 3,484,619 12/1969 Proud, Jr. ........................ 333/20 X

*Primary Examiner*—Paul L. Gensler
*Attorney, Agent, or Firm*—Nathan Edelberg; Robert P. Gibson; Saul Elbaum

[57] ABSTRACT

A method and apparatus for compressing high intensity current pulses and for providing an impedance transformation which increases the magnitude of the current of the pulses. A pulse is injected into a transmission line and after the pulse energy is converted to entirely electrostatic form the transmission line is discharged along the length thereof instead of out the end. The transmission line may be longitudinal, or in the shape of a torus, and the discharging may be either synchronous or asynchronous. The method and apparatus may be useful in compressing deuterium/tritium pellets to the point of nuclear burn.

13 Claims, 6 Drawing Figures

HIGH POWER PULSE COMPRESSION TECHNIQUES

RIGHTS OF THE GOVERNMENT

The invention described herein may be manufactured, used, and licensed by or for the United States Government for governmental purposes without the payment to me of any royalty thereon.

The present invention relates to a method and apparatus for compressing high intensity current pulses, and for providing an impedance transformation which increases the magnitude of the current of the pulses.

The present invention was developed to compress and increase the magnitude of current pulses generated by an existing current generating facility because it was necessary to provide shorter, higher intensity pulses to the plates of a field emission diode so that a shorter, higher intensity electron beam could be emitted by the diode.

The shorter high intensity electron beam pulse was necessary in order to successfully compress deuterium/tritium pellets to the point where thermonuclear burn is induced, and this was the end application for which the present invention was developed. While the invention will therefore be described with reference to the specific application of modifying an existing voltage, current or electron beam pulse generator to provide suitable electron beam pulses for compressing deuterium/tritium pellets, it should be understood that the invention is not limited thereto but rather relates to the compression of electromagnetic energy pulses generally, to the intensification thereof, and to matching a high impedance generator to a low impedance load. Accordingly, the invention is not to be limited by the following description in the specification but only by the claims appended hereto.

It is known that when pellets comprised of a mixture of deuterium and tritium are bombarded with an appropriate type of high intensity energy, a thermonuclear micro-explosion is induced, which is a simulation of the explosion of an actual nuclear device and may be useful in studying the effects of such explosions as an alternative to or a supplement to, underground nuclear testing. The implosion of such pellets provides an intense source of 14 MeV neutrons and a copious fluence of low energy X-rays and may even be suitable for commercial power production. The implosion and thermonuclear burning of a small (~1 mm diameter) sphere of D/T mixture, initially at liquid density, is capable of producing approximately the same radiation yield at a distance of 1 m from the pellet as one would observe from an underground test at 300 m from the device. While initial effort was directed at providing pulsed laser beams to implode the pellets, it has been observed that the use of electron beams may be advantageous in certain respects.

For electron beam implosion of a D/T pellet, it is necessary to utilize a stored energy source of 1–10 MJ which is capable of delivering the energy to the pellet in a beam of ~5 Megaamperes in a few tens of nanoseconds. Of course, the problem that one encounters here is the larger the amount of stored energy, the more difficult it is to deliver the energy in short periods of time.

The AURORA machine, operated by Harry Diamond Laboratories, is an electron beam pulse generating apparatus (also generates gamma rays) which has a basic energy storage capability of up to 5 MJ, but which has a short circuit current output of less than 3M amperes and an energy delivery time which exceeds 150 n seconds. It was the goal of the project from which the present invention evolved, to shorten the pulse output of AURORA and to increase the current output by impedance transformation.

The invention will be better understood by referring to the accompanying drawings in which.

Figure 1:
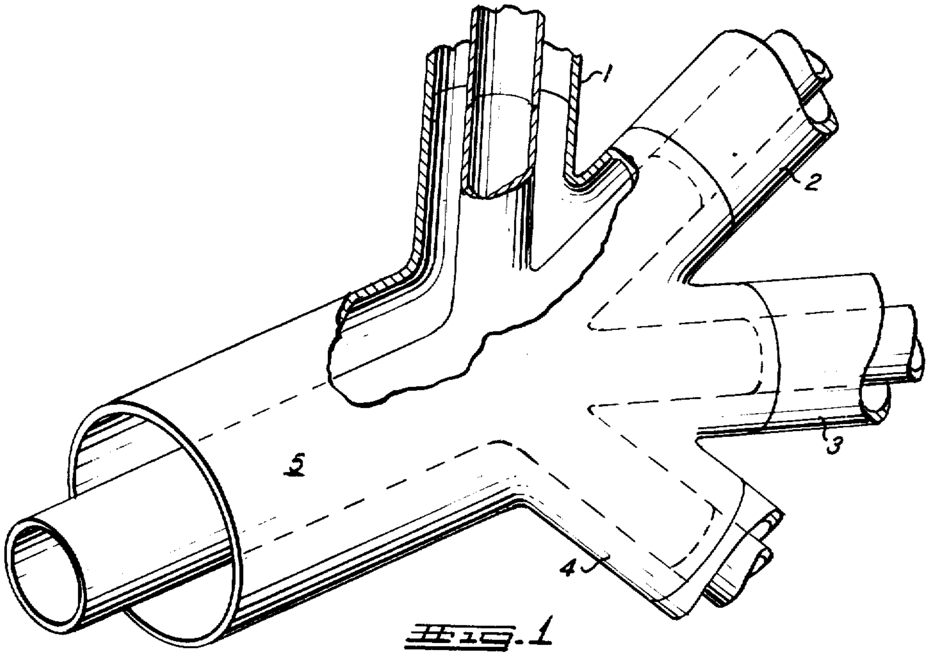
FIG. 1 is a pictorial representation of the four co-axial pulse output lines of the AURORA machine which are merged into a single co-axial line.

The AURORA generator is comprised of a Marx generatorbank which feeds four parallel oil-insulated Blumlein pulse forming networks. In FIG. 1 co-axial lines 1, 2, 3 and 4 are the outputs of the Blumlein networks and they are spliced or otherwise connected together in appropriate fashion to form coaxial output line 5, as illustrated. The reason that four generator output lines are used in AURORA and are merged into a single line instead of using a single line out of the generator is simply that the practical energy capacity limit of a single generating unit is one-fourth that desired. In FIG. 1 the current in line 5 is four times as great as in any of the single lines. Also as a practical matter, the inner conductor of the co-axial cable would probably be hollow, and any suitable dielectric such as vacuum, transformer oil or de-ionized and purified water could be used, though it is believed that transformer oil is preferred.

In the AURORA machine unmodified by the invention, the output line 5 may be fed directly to the cathode of a field emission diode for emitting an electron beam pulse. According to the invention, however, a pulse compression and impedance transformation unit is interposed between the pulse forming units and the load, and one embodiment thereof is shown in FIG. 2.

Figure 2:
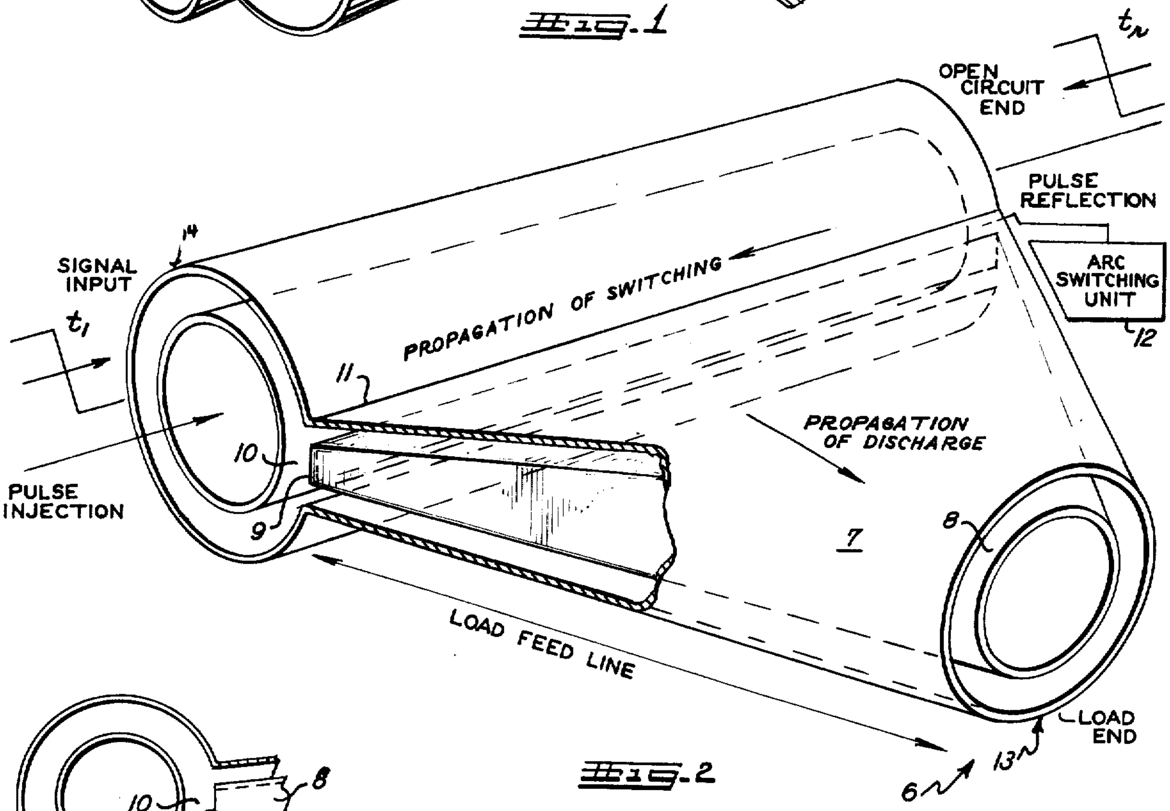
FIG. 2 is a perspective view of an illustrative embodiment of the invention which utilizes a longitudinal line for absorbing the injected pulse.
Figure 3:
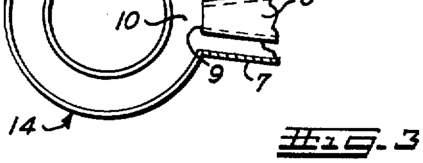
FIG. 3 is a side sectional view of the embodiment of FIG. 2.

Referring to FIG. 2, a current pulse is shown being injected into the left end of longitudinal co-axial line 14, which is a continuation of line 5 in FIG. 1. Although a case may be made for making the longitudinal line 14 somewhat shorter than the electrical length of the pulse, in general the line is made long enough with respect to the length of the pulse so that the pulse is totally absorbed. The line is open circuited at the right hand end in the Figure and the pulse is therefore reflected when it reaches this end, thereby setting up a standing wave in the region where the incident and reflected waves overlap, all the magnetic wave energy in the electromagnetic wave being converted to electrical energy in this region so that only electrostatic energy is present in the region of overlap. The amplitude of the standing wave is twice that of the incident wave.

With the standing electrostatic wave present, the line looks like a D.C. charged co-axial capacitor, and after the standing wave is formed the line is discharged. Co-axial discharge line 6 is comprised of outer and inner hollow member 7 and 8 respectively and, as shown, is approximately triangular in shape. The outer member 7 is joined to the outer conductor of longitudinal line 14 at joint 11 or by soldering, welding, etc., but the end 9 of the inner member 8 is separated by gap 10 from the inner conductor of the longitudinal line.

As known to those skilled in the art, gap 10 is an arc switching gap and the two inner conductors may be electrically connected at selected positions along their respective lengths by causing an arc to jump the gap at the positions, and this is how the line 14 is discharged. Arc switching unit 12, the details of which are known to those skilled in the art is a unit for selectively causing an arc to discharge line 14. The line may be discharged either synchronously or asynchronously. If it is discharged synchronously, switching unit 12 is arranged to arc all parts of the gap (or at least the parts of the gap along the extent of the standing wave) simultaneously. In this case discharge line 6 is arranged so that all straight line paths from the input end 9 of the discharge line to the load end 13 are approximately the same length. Hence the discharged energy from the various points along the length of longitudinal line 14 will arrive at the load end of the discharge line at approximately the same time, thereby compressing the pulse which was inputted to line 14. A field emission diode may be the load fed by the discharge line.

The compression mechanism operates as follows. Assuming that the method and apparatus of the invention were not employed, a pulse fed into one end of the longitudinal line could not exit from the other end in a shorter time than it took to inject the pulse in the first place (the pulse length). By switching the line along its length however, and causing the pulse energy to exit from along the length of the line instead of out the end, the exit time (or the pulse length) may be substantially reduced. Now the discharge time is limited by the diameter of the longitudinal line instead of by the length of the initial pulse. This is analagous to injecting a slug of water of a certain length into a pipe. In such a case it clearly may be visualized that it will take the slug a minimum time to exit from the opposite end of the pipe, but that if the pipe is slit along its length, the slug of water may exit much faster. Hence according to the invention, it is possible to extract the same energy as AURORA previously outputted, but in a shorter period of time.

Quite independent of the time compression attributes of the invention are its qualities as an impedance transformer. One reason that it is not possible to obtain the desired high current outputs from AURORA is because of the high output impedance of the machine. Since the transverse discharge impedance of a co-axial line is significantly smaller then its longitudinal impedance, inputting the energy longitudinally and extracting it transversely causes an impedance transformation to occur which allows the high impedance output to be matched to a low impedance load, providing greater output current.

As indicated above, the longitudinal line can be discharged asynchronously as well as synchronously. In such a case arc switching unit 12 would be arranged to "scan" an arc across gap 10, thereby successively discharging each consecutive lengthwise region of the line. In this case the geometry of discharge line 6 would be arranged so that the path length from the longitudinal line to the load end 13 of the discharge line is longer at the end of the longitudinal line which is discharged first then at the end of the line which is discharged last, so that energy from both ends (and at all points in between) arrives at the load end 13 at approximately the same time.

For instance, arc switching unit 12 may be arranged so that it begins scanning at the right end of the gap in FIG. 2 after the reflected wave reaches some predetermined point, e.g. two-thirds of the way back towards the left end of the line.

Figure 4:
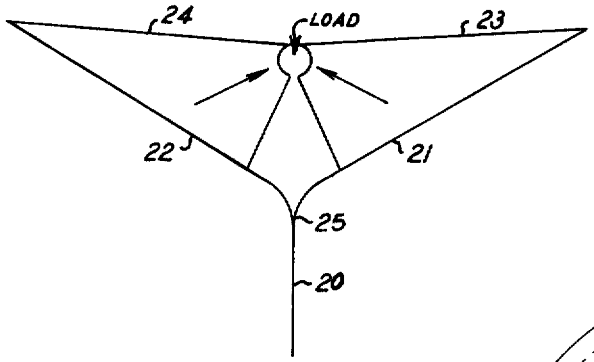
FIG. 4 shows an embodiment similar to that of FIG. 2, but providing a double instead of a single output.

FIG. 4 shows the embodiment of FIG. 2 adapted from a single to a double diode output design. The double output design is useful for providing electron deposition on deuterium/tritium pellets, which are spherical in shape.

Referring to FIG. 4, co-axial line 20 joins branch lines 21 and 22 at a Y junction 25. Each of lines 21 and 22 is similar to line 14 in FIG. 2. Associated with each of lines 21 and 22 is a discharge, or load feed line denoted by 23 and 24, respectively, in FIG. 4. Each of the discharge lines is similar to discharge line 6 in FIG. 2. As shown, the load is located between the load ends of the two discharge lines.

Figure 6:
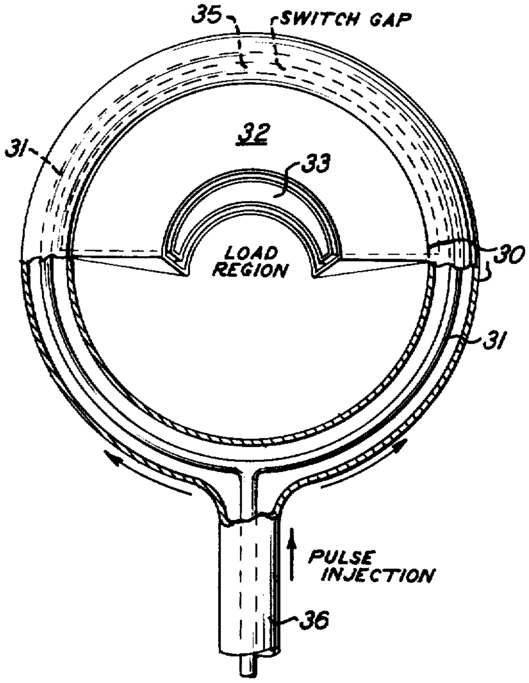
FIGS. 5 and 6 are partial sectional and schematic plan views respectively of an illustrative embodiment which utilizes a transmission line in the shape of a torus for absorbing the injected pulse.
Figure 5:
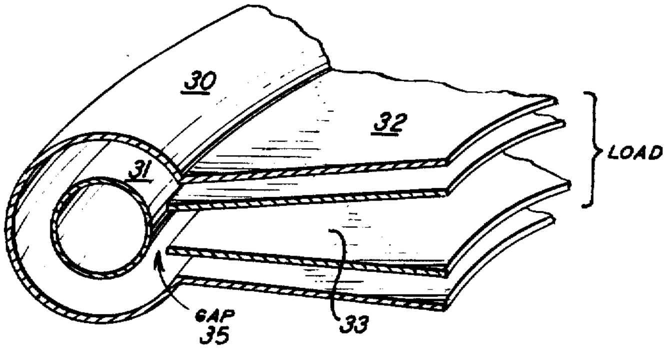

FIGS. 5 and 6 are partial cross-section and schematic plan views respectively of an embodiment of the invention in which a transmission line in the shape of a torus is utilized. Referring to these Figures, the co-axial torus transmission line is comprised of circular conductors 30 and 31 which are concentric with each other. The discharge line is comprised of outer conductor 32 and inner conductor 33. As in the embodiment of FIG. 2, the outer conductor 32 is soldered or welded to outer torus conductor 30 while a gap 35 is present between the two inner conductors 33 and 31.

In the embodiment shown, the pulse is injected into the torus by input transmission line 36 and the discharge line is connected to the half of the torus opposite the line 36 at the interior of the torus. Note that it is also possible to connect the discharge line to the exterior of the torus extending away from the torus instead of extending towards the center thereof as shown. In the embodiment shown, the injected pulse splits into two at the junction of the input line and the torus and half of the pulse energy travels around the torus to the right and the other half to the left as indicated by the arrows in FIG. 6. The two halves meet each other at a point on the torus directly across from the input line and as they pass this point they begin to cross over each other. Wherever the two pulse halves overlap the magnetic energy is converted to electric energy and the pulse energy becomes entirely electrostatic.

This entirely electrostatic energy is switched across gap 35 to discharge the torus and an optimum time for switching to be initiated is when the pulse halves have overlapped about 40%. Due to the circular shape of the discharge line, all discharge paths are the same length, and synchronous switching is preferred over asynchronous switching.

The torus embodiment concentrates power exceptionally well, especially for an application such as depositing electrons on a spherical D/T pellet, which sphere will receive rather uniform irradiation when placed at the center of the torus. Additionally, since all discharge paths are the same length, the torus embodiment is not susceptible to pulse spreading.

Typical results which can be achieved with the apparatus of the invention are compressing a 170 n sec pulse to about 20 n sec and increasing the megaampere current output by several times. The dimensions of the components will of course vary with the initial length of the pulse and the particular application, but in one illustrative embodiment, the length of line 14 is 15 feet and one leg of the triangular discharge line (the left leg in FIG. 2) is 15 feet long. In this specific embodiment asynchronous switching was used and switch initiation was begun at the right hand end at a rate of ⅓ Ft/n sec when the reflected wave reached a point two thirds of the way over from the right hand end of the line.

I wish it to be understood that I do not desire to be limited to the exact details of construction shown and described, for obvious modifications can be made by a person skilled in the art.

What is claimed is:

1. A method of compressing a high intensity electromagnetic energy pulse comprising the steps of:

injecting the electromagnetic energy pulse into a transmission line, the pulse length being approximately at least as small as the electrical length of the transmission line but longer than the transverse dimension of the line, activating a switching unit along the length of the transmission line causing the pulse energy to exit along the length of the line instead of out the end, and discharging the pulse energy onto a discharge line at least over an extent and at times along the transmission line so that the pulse energy at various points along the line arrives at a load end of the discharge line at approximately the same time, thereby compressing the high intensity electromagnetic pulse.

2. The method of claim 1 wherein said transmission line is discharged synchronously along the length thereof at least over said extent.

3. The method of claim 1 wherein said transmission line is discharged asynchronously along the length thereof at least over said extent.

4. Apparatus for compressing a high intensity electromagnetic energy pulse comprising:

a transmission line means, the electrical length of which is approximately at least as long as the length of the pulse, a discharge line means for discharging the energy pulse contained in the transmission line means, the length of the discharge line means being at least a portion of the length of said pulse and designed so the energy from various points along the length of the transmission line means can be discharged onto the discharge line means, means for injecting the energy pulse into the transmission line means, and means for discharging the high energy pulse along the length of the transmission line means onto the discharge line means whereby the high intensity electromagnetic pulse is compressed.

5. The apparatus of claim 4 wherein the discharge line means further includes one end which extends along at least a part of the length of said transmission line means and the other end of which ends at a load end and is designed so the energy from various points along the length of the transmission arrives at said load end of said discharge lines means at approximately the same time.

6. The apparatus of claim 5 wherein said means for discharging comprises means for synchronously discharging said transmission line means.

7. The apparatus of claim 6 wherein said discharge line means is arranged so that all straight line paths along said discharge line means from the transmission line means end to the load end thereof are approximately the same length.

8. The apparatus of claim 5 wherein said means for discharging comprises means for asynchronously discharging said transmission line means.

9. The apparatus of claim 8 wherein said discharge line means is arranged so that a straight line path along said discharge line means from the transmission line means end to the load end is longer at the part of the transmission line means which is discharged first than at the part which is discharged last.

10. The apparatus of claim 5 wherein said transmission line means comprises a longitudinal co-axial cable which is open circuited at the end away from the end in which said pulse is injected, and said discharge line means comprises an approximately triangular co-axial line, the base of the triangular line extending along the length of said transmission line means and the apex being at said load end.

11. The apparatus of claim 5 wherein said transmission line is in the shape of a torus.

12. The apparatus of claim 11 wherein said discharge line means extends interiorly of said torus.

13. The apparatus of claim 12 wherein said means for injecting comprises a line joining said torus transmission line at a particular area of said torus and wherein said discharge line does not extend around said entire torus but does extend on both sides of a point directly across the torus from said particular area.

* * * * *